(12) United States Patent  (10) Patent No.: US 8,686,340 B2
Ueno et al.  (45) Date of Patent: Apr. 1, 2014

(54) SOLID IMAGING DEVICE AND PORTABLE INFORMATION TERMINAL DEVICE HAVING PLURAL PIXELS BEING SHIELDED AND NOT SHIELDED FROM LIGHT

(75) Inventors: Risako Ueno, Tokyo (JP); Hideyuki Funaki, Tokyo (JP); Kazuhiro Suzuki, Tokyo (JP); Mitsuyoshi Kobayashi, Kanagawa-ken (JP); Honam Kwon, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 210 days.

(21) Appl. No.: 13/361,321

(22) Filed: Jan. 30, 2012

(65) Prior Publication Data
US 2013/0075586 A1  Mar. 28, 2013

(30) Foreign Application Priority Data
Sep. 27, 2011 (JP) .................................. 2011-210402

(51) Int. Cl.
*H01L 27/00* (2006.01)
(52) U.S. Cl.
USPC ....................................... 250/208.1; 250/239
(58) Field of Classification Search
USPC ........................ 250/208.1, 239, 214 R, 214.1; 257/290–292, 440, 441; 455/466, 566; 348/294–311; 345/173, 174
See application file for complete search history.

(56) References Cited

U.S. PATENT DOCUMENTS

| 8,054,355 B2 * | 11/2011 | McCarten et al. ............ 348/294 |
| 2012/0050589 A1 | 3/2012 | Ueno et al. |
| 2012/0057020 A1 | 3/2012 | Kobayashi et al. |
| 2012/0062771 A1 | 3/2012 | Ueno et al. |

FOREIGN PATENT DOCUMENTS

JP  2005-20024  1/2005

OTHER PUBLICATIONS

U.S. Appl. No. 13/530,595, filed Jun. 22, 2012, Ogasahara, et al.
U.S. Appl. No. 13/713,304, filed Dec. 13, 2012, Ueno et al.
U.S. Appl. No. 13/714,960, filed Dec. 14, 2012, Kobayashi, et al.
U.S. Appl. No. 13/221,195, filed Aug. 30, 2011, Suzuki, et al.
U.S. Appl. No. 13/221,061, filed Aug. 30, 2011, Ueno, et al.
U.S. Appl. No. 13/221,097, filed Aug. 30, 2011, Kobayashi, et al.

* cited by examiner

*Primary Examiner* — Que T Le
(74) *Attorney, Agent, or Firm* — Oblon, Spivak, McClelland, Maier & Neustadt, L.L.P.

(57) ABSTRACT

According to one embodiment, a solid imaging device includes an imaging substrate, a light-shielding member and a AD conversion circuits. The imaging substrate is two-dimensionally arranged with a plurality of pixels. The plurality of pixels have a top face formed with an optoelectronic conversion element for converting incident light into an electric charge and storing it and a back face opposite to the top faces. The imaging substrate is formed with a top face by the top face of the plurality of pixels and formed with a back face by the back face of the plurality of pixels. The light-shielding member is provided on the top face side of the imaging substrate. The AD conversion circuits is formed on the back face of the pixels shielded from the light.

20 Claims, 7 Drawing Sheets

SOLID IMAGING DEVICE AND PORTABLE INFORMATION TERMINAL DEVICE HAVING PLURAL PIXELS BEING SHIELDED AND NOT SHIELDED FROM LIGHT

CROSS-REFERENCE TO RELATED APPLICATIONS

This application is based upon and claims the benefit of priority from the prior Japanese Patent Application No. 2011-210402, filed on Sep. 27, 2011; the entire contents of which are incorporated herein by reference.

FIELD

Embodiments described herein relate generally to a solid imaging device and a portable information terminal device.

BACKGROUND

In a CMOS image sensor, a plurality of photoelectric conversion elements serving as pixels is formed on the top face of a semiconductor substrate in an array shape. Transistors and wiring layers for reading the electric charges converted by the photoelectric conversion elements are also formed on the top face in which the photoelectric conversion elements are formed. Therefore, when light is incident, a ratio (aperture ratio) of light received by the photoelectric conversion elements for the top face of the semiconductor substrate falls largely below 100%. Thus, in the solid imaging device in which the transistors and the wiring layers are formed on the same face as the photoelectric conversion elements, there has been a problem of low use efficiency of incident light.

As a technology for increasing the aperture ratio greatly, there is a back side irradiation-type structure, in which the photoelectric conversion elements are formed on a back face opposite to the top face on which the transistors and the wiring layers are formed, and light is made to enter from the back face.

DETAILED DESCRIPTION

In general, according to one embodiment, a solid imaging device includes an imaging substrate, a light-shielding member and a AD conversion circuits. The imaging substrate is two-dimensionally arranged with a plurality of pixels. The plurality of pixels have a top face formed with an optoelectronic conversion element for converting incident light into an electric charge and storing it and a back face opposite to the top faces. The imaging substrate is formed with a top face by the top face of the plurality of pixels and formed with a back face by the back face of the plurality of pixels. The light-shielding member is provided on the top face side of the imaging substrate. The AD conversion circuits is formed on the back face of the pixels shielded from the light. The plurality of pixels, when being irradiated with the light from above the light-shielding member, are distinguished into the pixels shielded from the light and the pixels not shielded from the light by the light-shielding member. The electric charges stored by the optoelectronic conversion element of the pixels not shielded from the light are converted into a digital signal by the AD conversion circuits.

According to another embodiment, a portable information terminal device includes the solid imaging device.

Various embodiments will be described hereinafter with reference to the accompanying drawings.

First Embodiment

Embodiments of the invention will be described below with reference to the drawings.

First, a first embodiment will be described.

Figure 1:
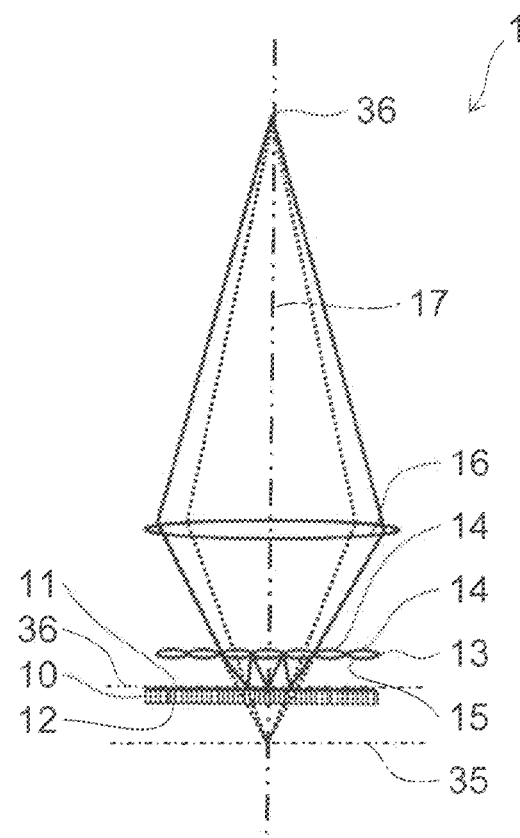
FIG. 1 shows an optical model diagram illustrating a solid imaging device according to a first embodiment.

FIG. 1 shows an optical model diagram illustrating a solid imaging device according to the first embodiment.

Figure 2:
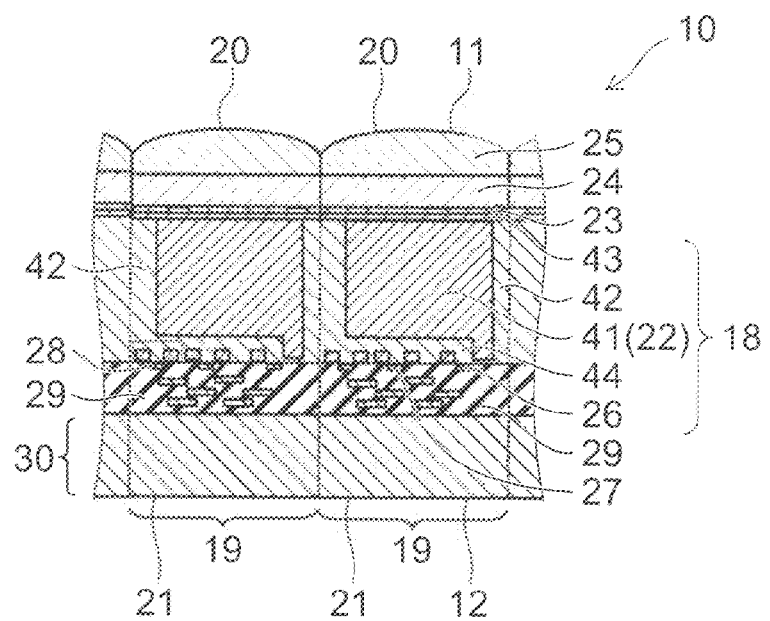
FIG. 2 shows a cross-sectional view illustrating an imaging substrate in the first embodiment.

FIG. 2 shows a cross-sectional view illustrating an imaging substrate in the first embodiment.

Figure 3A:
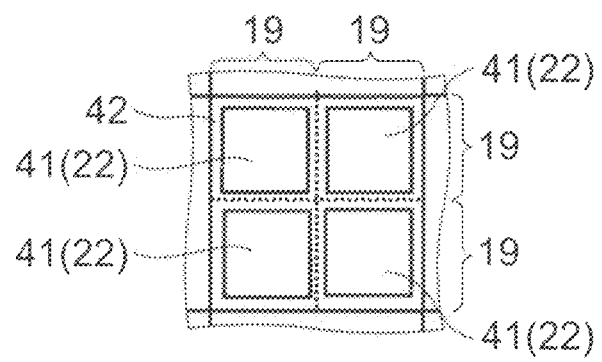
FIG. 3A shows a top face view illustrating a semiconductor substrate in the first embodiment.

FIG. 3A shows a top face view illustrating a semiconductor substrate in the first embodiment.

Figure 3B:
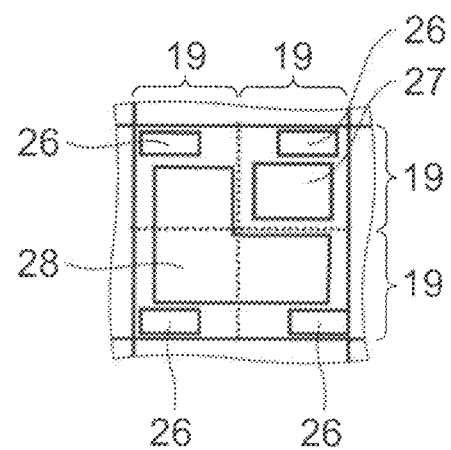
FIG. 3B shows a bottom face view illustrating the semiconductor substrate in the first embodiment.

FIG. 3B shows a bottom face view illustrating the semiconductor substrate in the first embodiment.

Figure 4A:
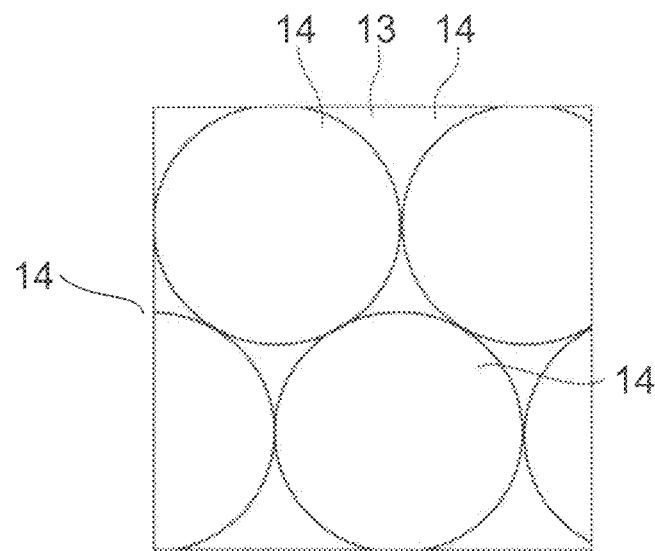
FIG. 4A shows a plane view illustrating a micro-lens array substrate in the first embodiment.
Figure 4B:
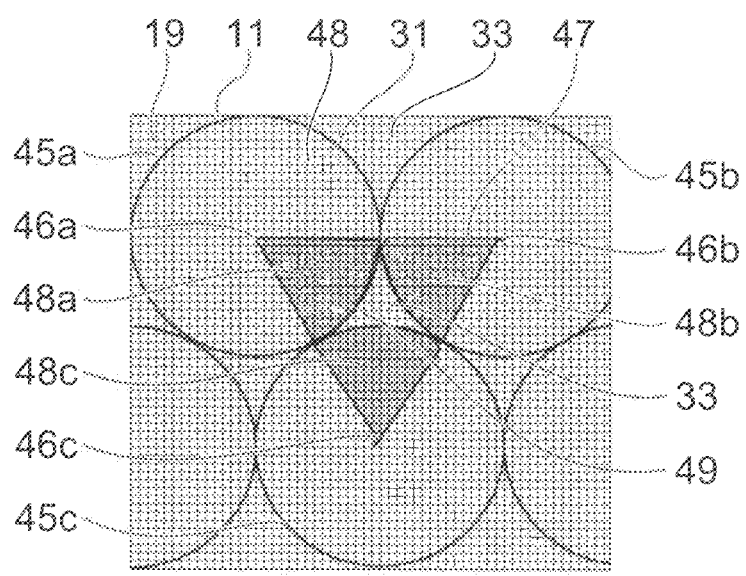
FIG. 4B shows a top face view illustrating an imaging substrate in the first embodiment.

FIG. 4A shows a plane view illustrating a micro-lens array substrate in the first embodiment, and FIG. 4B shows a top face view illustrating an imaging substrate in the first embodiment.

Figure 5A:
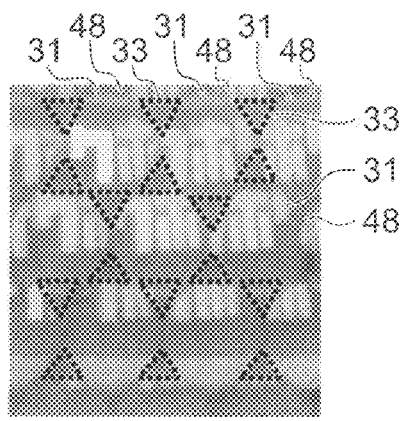
FIG. 5A shows a view illustrating an image formed every micro-lens in the first embodiment.
Figure 5B:
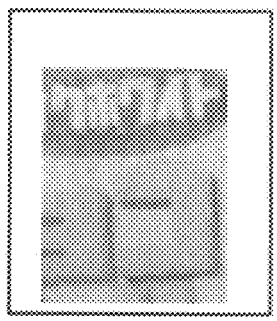
FIG. 5B shows a view illustrating a two-dimensional image obtained by subjecting these images to image processing.

FIG. 5A shows a view illustrating an image formed every micro-lens in the first embodiment, and FIG. 5B shows a view illustrating a two-dimensional image obtained by subjecting these images to image processing.

Figure 5C:
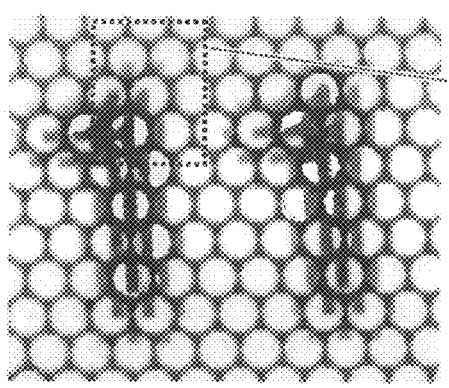
FIG. 5C shows a view illustrating an image formed every micro-lens in the first embodiment.
Figure 5C:
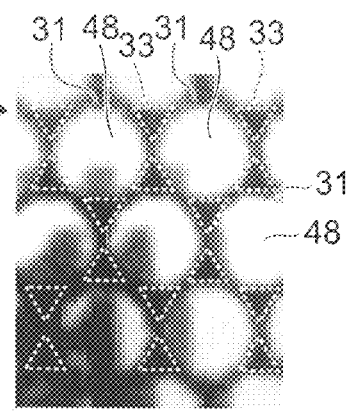
Figure 5D:
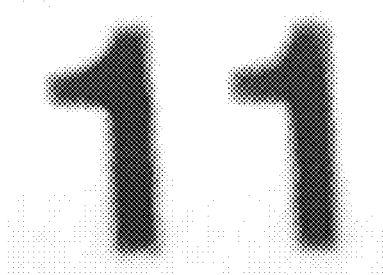
FIG. 5D shows a view illustrating a two-dimensional image obtained by subjecting these images to image processing.

FIG. 5C shows a view illustrating an image formed every micro-lens in the first embodiment, and FIG. 5D shows a view illustrating a two-dimensional image obtained by subjecting these images to image processing.

As shown in FIG. 1, the solid imaging device 1 according to the embodiment is provided with a plate-like imaging substrate 10.

On a top face 11 side of the imaging substrate 10, a micro-lens array substrate 13 is provided. The micro-lens array substrate 13 is provided in parallel with the imaging substrate 10. The micro-lens array substrate 13 is formed by using a transparent substrate, for example, a quartz plate. The micro-lens array substrate 13 is two-dimensionally arranged with a plurality of micro-lenses 14 in a plane in parallel with one face 15 of the micro-lens array substrate 13.

An imaging lens 16 is provided on the side opposite to the imaging substrate 10 in the micro-lens array substrate 13. The imaging lens 16 may be composed of the combination of a plurality of lenses in order to correct aberrations. The imaging lens 16 is arranged in such a manner that its optical axis 17 vertically passes one face 15 of the micro-lens array substrate 13 and the top face 11 of the imaging substrate 10. An imaging plane 35 of the imaging lens 16 is set below the imaging substrate 10. An imaging plane 36 of each micro-lens 14 formed by the light having transmitted the imaging lens 16 and having been focused is provided on the top face 11 of the imaging substrate 10.

As shown in FIG. 2, the imaging substrate 10 is provided on a semiconductor substrate 18 composed of, for example, silicon (Si). The imaging substrate 10 has a plurality of pixels 19 two-dimensionally formed in a plane in parallel with the top face 11 of the imaging substrate 10. The plurality of pixels 19 are provided by having the top faces 20 and the back faces 21 directed to the same direction.

The top face 11 of the imaging substrate 10 is formed by top faces 20 of the plurality of pixels 19. A bottom face 12 of the imaging substrate 10 is formed by the back faces 21 of the plurality of pixels 19.

In a semiconductor substrate 18 constituting the imaging substrate 10, a portion equivalent to the top face 20 side of the pixel 19 is formed with an optoelectronic conversion element 22 for converting and storing an incident light, for example, a photo diode 41. The side face of the photodiode 41 is formed with a p-type impurity region 42 of an element isolation layer. An impurity region 43 of a p$^+$-type layer is formed on the photodiode 41.

An antireflection layer 23 is provided on the optoelectronic conversion element 22. A color filter 24 is provided on the antireflection layer 23. In each pixel 19, a condensing lens 25 is provided on the color filter 24.

The bottom face of the semiconductor substrate 18 equivalent to the back face 21 side of the pixel 19 is formed with an n-type well 44. A transfer transistor 26 is formed below the n-type well 44. A read transistor 27 or an AD conversion circuit 28 is provided below the n-type well 44. A multilayer wiring layer 29 is formed below the semiconductor substrate 18.

A support substrate 30 is provided below the multilayer wiring layer 29. The support substrate 30 supports the semiconductor substrate 18 from the bottom face by nipping the multilayer wiring layer 29. These p and n type polarities may be made reverse to each other.

As shown in FIG. 3A, the optoelectronic conversion element 22 is formed in each of the pixels 19 which are arranged in a matrix shape.

In contrast, as shown in FIG. 3B, the transfer transistor 26, the read transistor 27, and the AD conversion circuit 28 are arranged in four pixels 19 which are arrayed in two columns and two rows as a basic unit. That is, out of these four pixels 19, the read transistor 27 is formed on the back face of one pixel 19. One L-shaped AD conversion circuit 28 is formed across the back faces of the three pixels 19 other than the pixel 19 on which the read transistor 27 is formed. Each pixel 19 is formed with one transfer transistor 26. The transfer transistor 26 is arranged on four corner portions of the basic unit which is formed by four pixels 19 arrayed in two columns and two rows. The basic unit is not limited to the array of two columns and two rows, and a basic unit having an array of N columns and M rows where N and M are natural numbers may set up an equivalent configuration.

As shown in FIG. 4A, when seeing the micro-lens array substrate 13 from a direction toward which the optical axis 17 extends, the shape of each micro-lens 14 is circular. When seeing from the direction toward which the optical axis 17 extends, the arrangement of the plurality of micro-lens 14 becomes a hexagonal closest arrangement. That is, each micro-lens 14 contacts the other six micro-lenses 14.

The size of one micro-lens 14 is larger than the size of one pixel 19. When the size of a circle of the micro-lens 14 is compared with the size of the pixel 19, for example, the size of the one micro-lens 14 is such a size that several to several hundreds of pixels 19 can be inserted into the circle.

As shown in FIG. 4B, in the top face 11 of the imaging substrate 10, the shape of a region 31 on which the light condensed by transmitting through each circular micro-lens 14 is incident becomes circular. The regions 31 are arranged in a hexagonal closest arrangement, reflecting the arrangement of the micro-lenses 14 in the micro-lens array substrate 13. Each region 31 is made to correspond to each micro-lens 14. An assembly of the pixels 19 arranged in the region 31 is referred to a pixel block 48.

In the top face 11 of the imaging substrate 10, there is a region 33 which is not irradiated with the light condensed by transmitting through each micro-lens 14. That is, the light condensed by transmitting through each micro-lens 14 does not enter the pixel 19 arranged in the region 33.

In this manner, the light having transmitted the micro-lens array substrate 13 and having been condensed forms the regions 31 and 33 on the top face of the imaging substrate 10.

Consequently, the micro-lens array substrate 13 becomes a light-shielding member. That is, when being irradiated with the light from above the micro-lens array substrate 13, the region 33 shielded from the light and the region 31 not shielded from the light are distinguished by the micro-lens array substrate 13.

A triangle whose vertexes are a center 46a, a center 46b, and a center 46c of a circle 45a, a circle 45b, and a circle 45c of three regions 31 adjacent to one another is used as a triangle 47. The assembly of the pixels 19 in the region where the circle 45a and the triangle 47 are superposed is referred to as a pixel block 48a. The assembly of the pixels 19 in the region where the circle 45b and the triangle 47 are superposed is referred to as a pixel block 48b. The assembly of the pixels 19 in the region where the circle 45c and the triangle 47 are superposed is referred to as a pixel block 48c. The pixels 19 belonging to the pixel blocks 48a to 48c are the pixels 19 not shielded from the light.

In contrast, the assembly of the pixels 19 in the region not belonging to the circles 45a to 45c in the region inside the triangle 47 is referred to as a pixel block 49. The pixels 19 belonging to the pixel block 49 are the pixels 19 shielded from the light.

Next, the operation of the solid imaging device 1 according to the embodiment will be described.

Light from a subject 36 is condensed by making the light transmit through the imaging lens 16, and is made to enter the micro-lens array substrate 13. Out of the light incident on the micro-lens array substrate 13, the light having reached the micro-lens 14 is made to transmit through each micro-lens 14 so as to be condensed every micro-lens 14, and an image is formed every micro-lens 14 on the top face 11 of the imaging substrate 10.

In the embodiment, the electric charge stored by the optoelectronic conversion element 22 of the pixels 19 that belong to the pixel blocks 48a, 48b, and 48c in the region inside the triangular 47 is read by the read transistor 27 formed on the back face 21 of the pixels 19 belonging to the pixel blocks 48a, 48b, and 48c, and the read electric charge is made an analogue signal by the transfer transistor 26, and is transferred to the AD conversion circuit 28 formed on the bottom face of the pixels 19 belonging to the pixel block 49 of the region 33 shielded from the light. The AD conversion circuit 28 formed on the back face of the pixels 19 belonging to the pixel block 49 converts the analogue signal corresponding to the electric charge read by the read transistor 27 in each pixel block 48a to 48c into a digital signal. The AD conversion circuit 28 formed on the back face of the pixels 19 belonging to the pixel blocks 48a, 48b, and 48c are not allowed to be operated.

Thus, the electric charge stored by the optoelectronic conversion element 22 is converted into a digital signal by the AD conversion circuit 28 with the plurality of pixels 19 arranged inside the triangular 47 as one unit.

Then, the digital signals which are AD-converted every pixel blocks 48a to 48c are subjected to the image processing.

As shown in FIG. 5A and FIG. 5C, the image of the subject 36 is formed every region 31 that corresponds to each micro-lens 14. The image formed every region 31 is different little by little due to a difference in position in which the micro-lens 14 is arranged. Thus, a plurality of images is obtained in which parallax is caused between the micro-lenses by the number of the micro-lenses 14.

An image group, in which the parallax obtained from the number of micro-lenses 15 occurs, is subjected to the image processing, thereby the estimation of a distance between the subject 36 and the solid imaging device 1 is performed based on the principles of triangulation.

Further, as shown in FIG. 5B and FIG. 5D, the image group in which the parallax obtained from the number of micro-lens 14 occurs is subjected to combined image processing, thereby making the images combined a second dimensional image.

Next, an effect of the solid imaging device 1 according to the embodiment will be described.

With the solid imaging device 1 according to the embodiment, the optoelectronic conversion element 22 is formed on the top face 20 of the pixel 19 serving as a light incident plane, and the transfer transistor 26, the read transistor 27, and the AD conversion circuit 28 are formed on the back face 21 opposite to the light incident plane. Consequently, a ratio of the light received by the optoelectronic conversion element 22 for the top face 11 of the imaging substrate 10, that is, an aperture ratio can be improved.

When the micro-lenses 14 are arranged in hexagonal closest arrangement, a ratio of the region 33 shielded from the light occupying the top face 11 of the imaging substrate 10 can be reduced to 9.3%.

Thereby, the solid imaging device 1 can be highly integrated.

Since the AD conversion circuit 28 formed on the back face 21 of the pixel 19 shielded from the light is made to operate, the malfunction of the AD conversion circuit 28 can be prevented from occurring due to the light that transmits the optoelectronic conversion element 22.

Further, since the AD conversion is made with the electric charge read in parallel with each of the pixel blocks 48a to 48c, the image processing can be higher than those of the conventional column parallel AD converters. Thus, no trouble occurs such as a rolling shutter problem caused by the low speed of the conventional column parallel AD conversion.

By providing the micro-lens array substrate 13 between the imaging lens 16 and the imaging substrate 10, the imaging plane 35 can be made to approach the imaging plane 36 near the imaging lens 16. As a result, the solid imaging device can be miniaturized.

First Modified Example of the First Embodiment

Next, a first modified example of the first embodiment will be described.

Figure 6A:
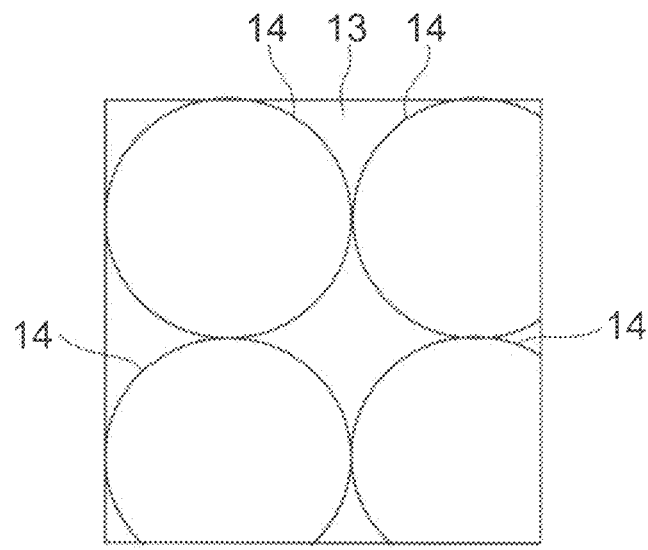
FIG. 6A shows a plane view illustrating a micro-lens array substrate in a first modified example of the first embodiment.
Figure 6B:
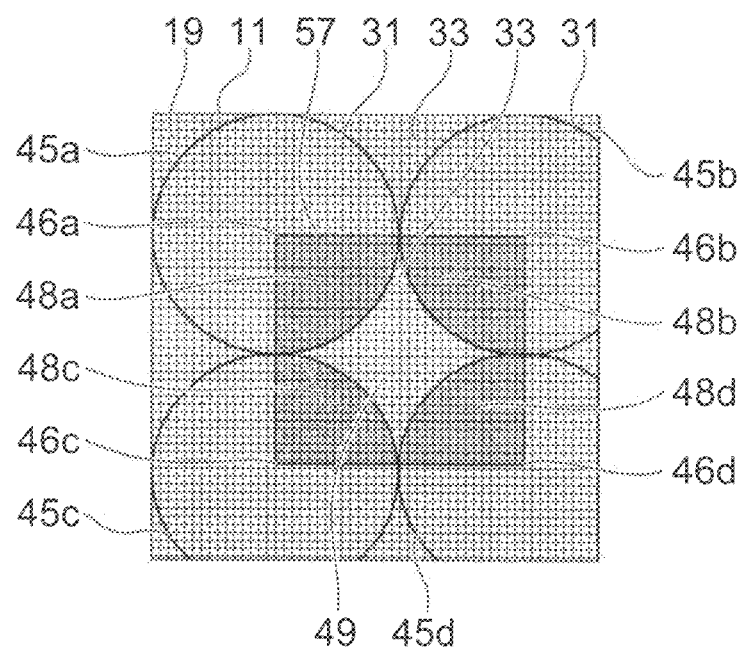
FIG. 6B shows a top view illustrating an imaging substrate in the first modified example of the first embodiment.

FIG. 6A shows a plane view illustrating a micro-lens array substrate in the first modified example of the first embodiment, and FIG. 6B shows a top view illustrating an imaging substrate in the first modified example of the first embodiment.

As shown in FIG. 6A, in the modified example, micro-lenses 14 in the micro-lens array substrate 13 are arranged in square array. The square array means that the micro-lenses 14 are arranged in one direction and the other direction orthogonal to one direction in a plane in parallel to one face 15 of the micro-lens array substrate 13. In addition, the square array means that each micro-lens 14 is surrounded by four micro-lenses 14, and each micro-lens 14 are arranged in such a manner as to contacts four micro-lenses 14 that surround each micro-lens 14.

As shown in FIG. 6B, the region 31 is arranged in square array, reflecting the arrangement of the micro-lenses 14 in the micro-lens array substrate 13.

When it is assumed in one region 31 that the center of the circle 45a is set as a center 46a, and the center of the circle 45b adjacent to one direction is set as a center 46b, and the center of the circle 45c adjacent to the other direction is set as a center 46c, and with respect to a line segment connecting the center 46b and the center 46c, a circle located in a position symmetrical to the circle 45a is set as a circle 45d, and the center of the circuit 45d is set as a center 46d, then, a rectangle 57 is formed by the center 46a, the center 46b, the center 46c, and the center 46d.

The assembly of the pixels 19 in the region where the circle 45a and the rectangle 57 are superposed is referred to as a pixel block 48a. The assembly of the pixels 19 in the region where the circle 45b and the rectangle 57 are superposed is referred to as a pixel block 48b. The assembly of the pixels 19 in the region where the circle 45c and the rectangle 57 are superposed is referred to as a pixel block 48c. The assembly of the pixels 19 in the region where the circle 45d and the rectangle 57 are superposed is referred to as a pixel block 48d. The pixels 19 belonging to the pixel blocks 48a to 48c are the pixels 19 not shielded from the light.

In contrast, the assembly of the pixels 19 in the region not belonging to the circles 45a to 45d in the region inside the rectangle 57 is referred to as a pixel block 49. The pixels 19 belonging to the pixel block 49 are the pixels 19 shielded from the light.

The AD conversion circuit 28 formed on the bottom face of the pixels 19 belonging to the pixel block 49 converts the electric charge read by the read transistor 27 in each of the pixel blocks 48a to 48d into digital signals.

Thus, the electric charge stored by the optoelectronic conversion element 22 with the plurality of pixels 19 arranged inside the rectangle 57 as one unit is converted into a digital signal by the AD conversion circuits 28.

In the modified example, since an ratio occupied by the region 33 shielded from the light on the top face 11 of the imaging substrate 10 is reduced to 21.5%, a ratio of the pixels 19 including the AD conversion circuit 28 to be operated can be enhanced. Therefore, high-speed processing is made possible.

The structure, the operation, and the effect other than the above described in the modified example are the same as the structure, the operation, and the effect of the first embodiment.

Second Modified Example of the First Embodiment

Figure 7:
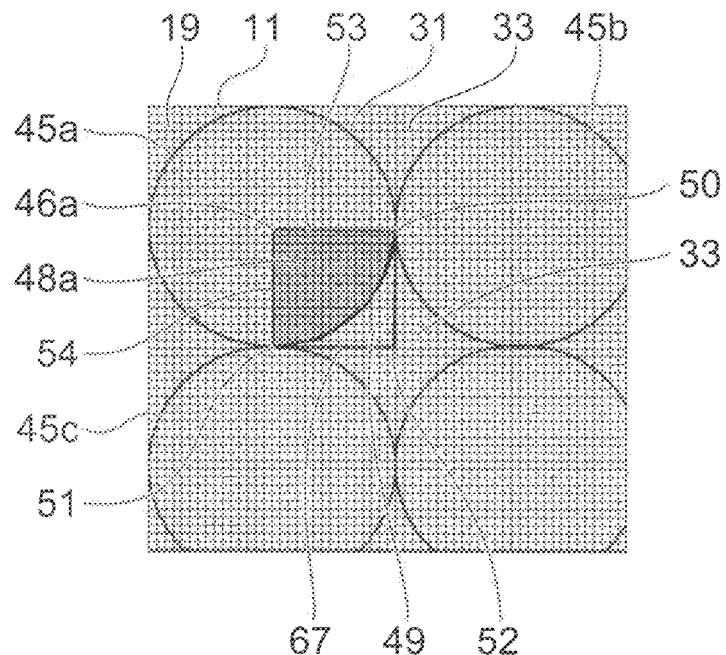
FIG. 7 shows a top view illustrating an imaging substrate in a second modified example of the first embodiment.

FIG. 7 shows a top view illustrating an imaging substrate in a second modified example of the first embodiment.

In the modified example, the micro-lenses 14 in the micro-lens array substrate 13 are arranged in square array similarly to the first modified example of the first embodiment.

Consequently, as shown in FIG. 6, the region 31 is arranged in square array, reflecting the arrangement of the micro-lenses 14 in the micro-lens array substrate 13.

When it is assumed that a contact point between the circle 45a and the circle 45b is set as a contact point 50, and a contact point between the circle 45a and the circle 45c is set as a contact point 51, and with respect to a line segment connecting the contact point 50 with the contact point 51, a point in a position symmetrical to a center 46a is set as a point 52, then, a rectangle 67 is formed by the center 46a, the contact point 50, the contact point 51, and the point 52.

The assembly of the pixels 19 in the region where the circle 45a and the triangle 67 are superposed is referred to as a pixel block 48a. The pixels 19 belonging to the pixel block 48a are the pixels 19 not shielded from the light.

In contrast, the assembly of the pixels 19 in the region not belonging to the circles 45a in the region inside the rectangle 67 is referred to as a pixel block 49. The pixels 19 belonging to the pixel block 49 are the pixels 19 shielded from the light.

The AD conversion circuit 28 formed on the back face of the pixels 19 belonging to the pixel block 49 converts the analogue signal read by the read transistor 27 into a digital signal in the pixel block 48a.

Thus, the electric charge stored by the optoelectronic conversion elements 22 with the plurality of pixels 19 arranged inside the rectangle 67 as one unit is converted into digital signals by the AD conversion circuits 28.

The structure, the operation, and the effect other than the above described in the modified example are the same as the structure, the operation, and the effect of the first embodiment.

Third Modified Example of the First Embodiment

Figure 8A:
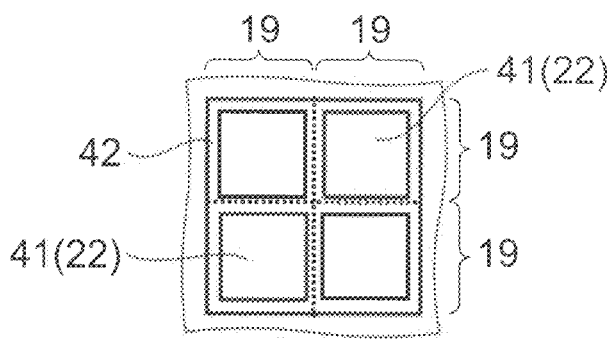
FIG. 8A shows a top face view illustrating a semiconductor substrate in a third modified example of the first embodiment.

FIG. 8A shows a top face view illustrating a semiconductor substrate in a third modified example of the first embodiment.

Figure 8B:
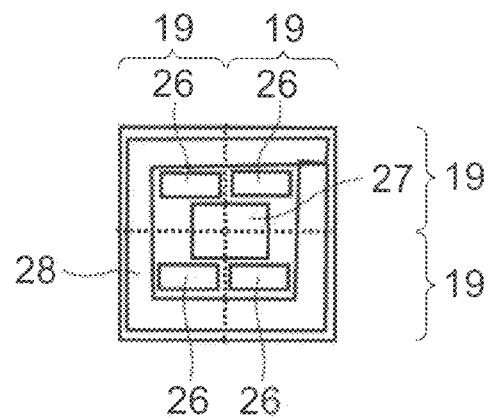
FIG. 8B shows a bottom face view illustrating the semiconductor substrate in the third modified example of the first embodiment.

FIG. 8B shows a bottom face view illustrating the semiconductor substrate in the third modified example of the first embodiment.

As shown in FIG. 8A, an optoelectronic conversion element 22 is formed in each pixel 19 arranged in a matrix shape.

In contrast, as shown in FIG. 8B, a transfer transistor 26 is formed in the central part of the back face 21 of each pixel 19. These transistors 26 are arranged in four pixels 19 aligned in two columns and two rows as a basic unit. The read transistor 27 is formed so as to extend across these four pixels 19 in the central part of these basic units. The AD conversion circuit 28 is formed along a peripheral region in the back face of the assembly of four pixels 19. The structure, the operation, and the effect other than the above described in the modified example are the same as the structure, the operation, and the effect of the first embodiment. The basic unit is not limited to the array of two columns and two rows, and a basic unit having an array of N columns and M rows where N and M are natural numbers may set up an equivalent configuration.

Second Embodiment

Next, a second embodiment will be described.

Figure 9:
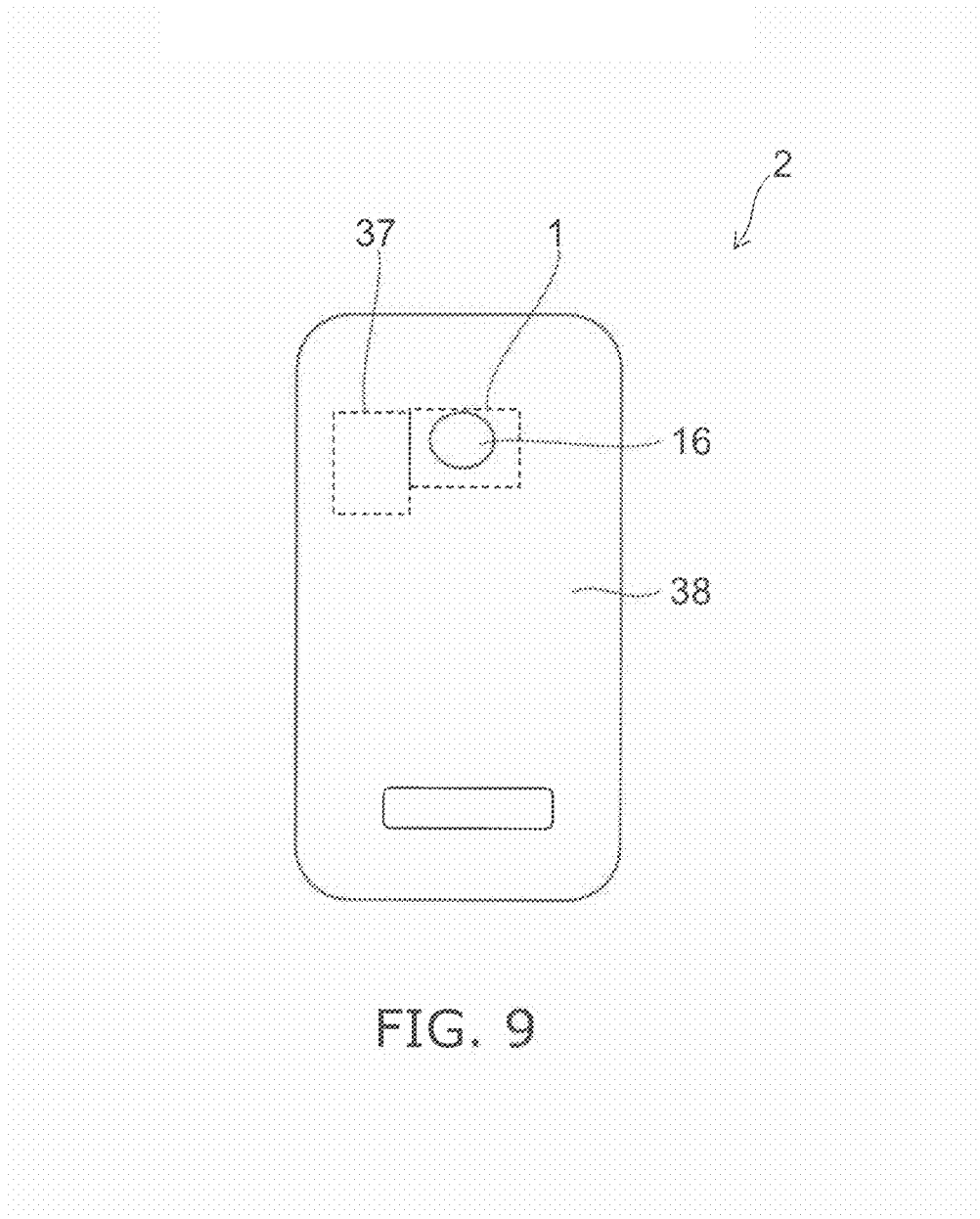
FIG. 9 shows a plane view illustrating a portable information terminal device according to a second embodiment.

FIG. 9 shows a plane view illustrating a portable information terminal device according to a second embodiment.

As shown in FIG. 9, a portable information terminal device 2 according to an embodiment is provided with a solid imaging device 1.

The solid imaging device 1, for example, is the solid imaging device 1 according to the first embodiment. An imaging lens 16 of the solid imaging device 1 is arranged on one face 38 of the portable information terminal device 2.

The portable information terminal device 2 is provided with a memory device 37 connected to the solid imaging device 1.

Next, the operation of the portable information terminal device 2 according to the embodiment will be described.

An optical axis 17 of an imaging lens 15 of the solid imaging device 1 in the portable information terminal device 2 is directed to a subject 36. The subject 36 is photographed by operating the solid imaging device 1. The photographed image is recorded in the memory device 37. Furthermore, the photographed image is displayed in a display unit (not shown).

Next, the effect of the embodiment will be described.

The portable information terminal device 2 according to the embodiment realizes high integration by mounting the solid imaging device 1.

According to the embodiment as described above, a solid imaging device and a portable information terminal device capable of realizing high integration can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A solid imaging device comprising:
an imaging substrate two-dimensionally arranged with a plurality of pixels having a top face formed with an optoelectronic conversion element for converting incident light into an electric charge and storing it and a back face opposite to the top faces, and formed with a top face by the top face of the plurality of pixels and formed with a back face by the back face of the plurality of pixels;
a light-shielding member provided on a top face side of the imaging substrate; and,
AD conversion circuits formed on the back face of the pixels shielded from the light,
the plurality of pixels, when being irradiated with the light from above the light-shielding member, being distinguished into the pixels shielded from the light and the pixels not shielded from the light by the light-shielding member, and the electric charges stored by the optoelectronic conversion element of the pixels not shielded from the light being converted into a digital signal by the AD conversion circuits.

2. The device according to claim 1, wherein the AD conversion circuit is formed also on the back face of the pixels not shielded from the light.

3. The device according to claim 1, wherein
the light-shielding member is a micro-lens array substrate two-dimensionally arranged with micro-lenses.

4. The device according to claim 3,
wherein the pixels shielded from the light are the pixels arranged in a region not incident with the light having transmitted the micro-lenses and having been condensed, and
wherein the pixels not shielded from the light are the pixels arranged in a region incident with the light having transmitted the micro-lenses and having been condensed.

5. The device according to claim 4, wherein the micro-lenses are arranged in hexagonal closest arrangement on a top face of the micro-lens array substrate.

6. The device according to claim 5,
wherein a shape of the region incident with the light is circular, and
wherein the region incident with the light is arranged in hexagonal closest arrangement on the top face of the imaging substrate, and
wherein, with the pixels arranged in a triangle region connecting each center of three adjacent regions incident with the light as a unit, the electric charge is converted into the digital signals.

7. The device according to claim 4, wherein the micro-lenses are arranged in square arrangement on the top face of the micro-lens array substrate.

8. The device according to claim 7,
wherein a shape of the region incident with the light is circular,
wherein the region incident with the light is arranged in square arrangement on the top of the imaging substrate,
wherein assuming that the center of one region incident with the light is set as a first point, and the center of the region incident with the light adjacent to one direction from the one region incident from the light is set as a second point, and the center of the region incident with the light adjacent to the direction orthogonal to the one direction from the one region incident with the light is set as a third point, and with respect to a line segment connecting the second point and the third point, the center of the region incident with the light in a position symmetrical to the one region incident with the light is set as a fourth point, then, with the pixels arranged in the rectangular region formed from the first point, the second point, the third point, and the fourth point as an unit, the electric charge is converted into the digital signal.

9. The device according to claim 7,
wherein the shape of the region incident with the light is circular,
wherein the regions incident with the light are arranged in square arrangement on the top of the imaging substrate,
wherein assuming that a center of one region incident with the light is set as a first point, and a contact point between the region incident with the light adjacent to one direction from the one region incident with the light and the one region incident with the light is set as a second point, and a contact point between the region incident with the light adjacent to the direction orthogonal to the one direction from the one region incident with the light and the one region incident with the light is set as a third point, and with respect to a line segment connecting the second point and the third point, a point located in a position symmetrical to the first point is set as a fourth point, then, with the pixels arranged in a rectangle region formed from the first point, the second point, the third point, and the fourth point as an unit, the electric charge is converted into the digital signal.

10. The device according to claim 1, wherein on second faces of the pixels, a read transistor for reading the electric charge stored by the optoelectronic conversion element is provided.

11. The device according to claim 10, wherein on the second faces of the pixels, a transfer transistor for transferring the electric charge read by the read transistor to the AD conversion circuit as analog signals is provided.

12. The device according to claim 11, wherein when four pixels arranged in two columns and two rows are set as a basic unit, the back face of the one pixel is formed with the read transistor, and the one AD conversion circuit is formed across the back face in the three pixels other than the pixel formed with the read transistor.

13. The device according to claim 11, wherein when four pixels arranged in two columns and two rows are set as a basic unit, the read transistor is provided so as to extend across the back face of the four pixels in the central part of the back face of the basic unit, and the AD conversion circuit is formed across a peripheral region in the back face of the basic unit.

14. The device according to claim 3, wherein an imaging lens is further provided on a side opposite to the imaging substrate in the micro-lens array substrate.

15. The device according to claim 14, wherein an imaging plane of the imaging lens is set below the imaging substrate.

16. The device according to claim 3, wherein an image corresponding to each of the micro-lenses is an image mutually generating a parallax.

17. The device according to claim 16, wherein the device connects the image mutually generating the parallax to make two-dimensional image.

18. The device according to claim 16, wherein the device processes the image mutually generating the parallax to obtain a distance to a subject.

19. The device according to claim 1, wherein the optoelectronic conversion element is a photodiode.

20. A portable information terminal device comprising:
a solid imaging device,
the solid imaging device including:
an imaging substrate two-dimensionally arranged with a plurality of pixels having a top face formed with an optoelectronic conversion element for converting incident light into an electric charge and storing it and a back face opposite to the top faces, and formed with a top face by the top face of the plurality of pixels and formed with a back face by the back face of the plurality of pixels;
a light-shielding member provided on a top face side of the imaging substrate; and,
AD conversion circuits formed on the back face of the pixels shielded from the light,
the plurality of pixels, when being irradiated with the light from above the light-shielding member, being distinguished into the pixels shielded from the light and the pixels not shielded from the light by the light-shielding member, and
the electric charges stored by the optoelectronic conversion element of the pixels not shielded from the light being converted into a digital signal by the AD conversion circuits.

* * * * *